(12) United States Patent
Ravi

(10) Patent No.: US 6,743,697 B2
(45) Date of Patent: Jun. 1, 2004

(54) THIN SILICON CIRCUITS AND METHOD FOR MAKING THE SAME

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,626

(22) Filed: Dec. 27, 2000

(65) Prior Publication Data

US 2002/0004287 A1 Jan. 10, 2002

Related U.S. Application Data

(63) Continuation-in-part of application No. 09/607,252, filed on Jun. 30, 2000.

(51) Int. Cl.$^7$ .......................... H01L 21/30; H01L 21/46
(52) U.S. Cl. ..................... 438/459; 438/455; 438/691; 438/745; 438/977
(58) Field of Search ................................ 438/455, 459, 438/478, 691, 745, 974, 977

(56) References Cited

U.S. PATENT DOCUMENTS

| | | | |
|---|---|---|---|
| 3,928,092 A | | 12/1975 | Ballamy et al. |
| 4,283,837 A | | 8/1981 | Slob |
| 4,547,258 A | * | 10/1985 | Witter et al. ................... 117/21 |
| 5,024,723 A | * | 6/1991 | Goesele et al. .............. 438/459 |
| 5,284,803 A | * | 2/1994 | Haisma et al. .............. 438/459 |
| 5,391,257 A | * | 2/1995 | Sullivan et al. ............. 438/458 |
| 5,455,202 A | * | 10/1995 | Malloy et al. .............. 438/118 |
| 5,496,743 A | * | 3/1996 | Luryi ......................... 438/118 |
| 5,654,226 A | * | 8/1997 | Temple et al. .............. 438/458 |
| 5,741,733 A | * | 4/1998 | Bertagnolli et al. ........ 438/152 |
| 5,853,478 A | | 12/1998 | Yonehara et al. |
| 5,872,025 A | * | 2/1999 | Cronin et al. ............... 438/109 |
| 5,877,034 A | * | 3/1999 | Ramm et al. ................. 438/15 |
| 5,885,884 A | | 3/1999 | Jan et al. |
| 5,910,019 A | | 6/1999 | Watanabe et al. |
| 6,032,611 A | | 3/2000 | Asakawa et al. |
| 6,388,290 B1 | | 5/2002 | Celler et al. |

OTHER PUBLICATIONS

Wolf and Tauber, "Silicon processing for the VLSI Era", vol. 1, p. 532, Lattice Press (1986).*

* cited by examiner

*Primary Examiner*—Kamand Cuneo
*Assistant Examiner*—Asok Kumar Sarkar
(74) *Attorney, Agent, or Firm*—Blakely, Sokoloff, Taylor & Zafman LLP

(57) ABSTRACT

A method of coupling a single crystal semiconductor layer to a support substrate. Thinning the single crystal layer. Introducing an integrated circuit into the single crystal layer. And removing the thinned single crystal layer with the integrated circuit from the support substrate.

6 Claims, 3 Drawing Sheets

THIN SILICON CIRCUITS AND METHOD FOR MAKING THE SAME

CROSS-REFERENCE TO RELATED APPLICATION

This application is a Continuation-In-Part of copending application Ser. No. 09/607,252, filed Jun. 30, 2000 by applicant Kramadhati V. Ravi, entitled "METHOD FOR THE MANUFACTURE OF SEMICONDUCTOR DEVICES AND CIRCUITS".

BACKGROUND OF THE INVENTION

1. Field of the Invention

The invention generally relates to semiconductor based products and more particularly to the fabrication and design of integrated circuit structures.

2. Background of the Invention

A typical integrated circuit consists of a substrate on which devices are formed in and/or on the substrate. Such devices include for example transistors and capacitors that may be interconnected with one another and/or communicate with an external source.

One common approach to making an integrated circuit is to fabricate the circuit as part of a wafer such as a semiconductor wafer on which multiple integrated circuits are formed simultaneously. Fabricating these circuits at the wafer level allows similar circuits to be formed at one time which tends to make the fabrication process more efficient. Once formed the wafer is singulated into individual dies or chips. Currently, single crystal silicon wafers are up to 300 mm or 12 inches in diameter and about 750 microns thick. A 300 mm diameter wafer needs to be about 750 microns thick to avoid problems with breakage during processing and warpage of the wafer.

There are currently applications for semiconductor integrated circuits that require die (device) thickness of substantially less than 750 microns. In order to conserve space in packaging, and to increase memory density in a given area, such as flash memory circuits, an emerging technology is to stack integrated circuits one on top of another. In these situations, it would be beneficial to have circuit thicknesses of less than 100 microns.

Currently, these requirements are being met by processing the circuits using a 750 micron thick wafer and then thinning the unused portion of the silicon wafer to reduce the thickness to a more suitable number of approximately 25 to 100 microns. The thinning technique is typically chemical-mechanical polishing or grinding. The difficulty of the current method is that the thinning is done after the devices and circuits have been processed into the wafer, and thus contributes to loss of circuits through damage to the wafer.

An improved minimum thickness integrated circuit and a method of making a minimum thickness wafer is needed.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

A method and apparatus are disclosed. According to one aspect of the invention, the method comprises coupling a single crystal layer to the surface of a support substrate such as a support substrate of a crystalline or polycrystalline material. At the interface of the single crystal and the support substrate there may be a differentially removable material, such as an oxide (e.g. silicon dioxide). In a further aspect, the method includes thinning the single crystal layer and forming circuit devices on the thinned layer. In a still further aspect, the thinned layer having devices formed thereon is separated from the support substrate. In this regard, the method describes a process for the manufacture of thin semiconductor products. Thus, in one embodiment of the invention, a composite substrate of a single crystal semiconductor material and polycrystalline semiconductor material may replace existing 750 micron thick monolithic single crystal wafers, epitaxial silicon wafers, or silicon on insulator structures, as a durable integrated circuit device substrate suitable for typical integrated circuit process operations.

In the following description, for the purposes of explanation, numerous specific details are set forth in order to provide a thorough understanding of the invention. It will be apparent, however, to one skilled in the art that the invention may be practiced without some of these specific details. The following description and accompanying drawings provide various examples for the purposes of illustration. However, these examples should not be construed in a limiting sense as they are merely intended to provide examples of the invention rather than to provide an exhaustive list of all possible implementations of the invention.

Reference will now be made to drawings wherein like structures will be provided with like reference designations. In order to show the structures of the invention most clearly, the drawings included herein are diagrammatic representations of integrated circuit structures. Thus, the actual appearance of the fabricated structures, for example in a photomicrograph, may appear different while still incorporating the essential structures of the invention. Moreover the drawings show only the structures necessary to understand the invention. Additional structures known in the art have not been included to maintain the clarity of the drawings.

FIGS. 1–5 illustrate a technique for forming thin semiconductor products according to an embodiment of the invention.

Figure 1:
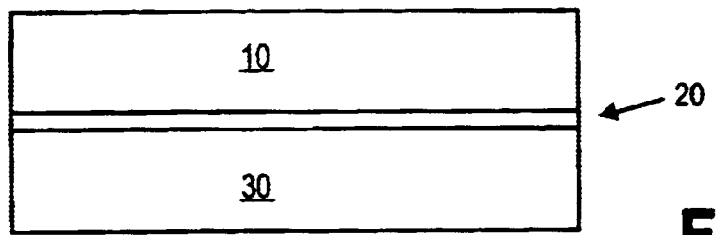
FIG. 1 is a schematic, cross-sectional side view of an oxidized single crystal semiconductor layer bonded to a support substrate in accordance with an embodiment of the invention.

FIG. 1 shows a composite structure consisting of single crystal semiconductor layer 10 oxidized and bonded through differentially removable material 20 to support substrate 30. Support substrate 30 is for example, single crystal or polycrystalline silicon. Substrate 30 may have a diameter similar to a semiconductor wafer diameter (e.g. on the order of six inches to 12 inches). Support substrate 30 has a thickness sufficient to support a single crystal layer through integrated circuit processing operations. A suitable thickness for support substrate 30 to permit conventional wafer processing with respect to the composite structure is on the order of 750 microns. Prior to forming the composite structure, the surface of support substrate 30 may be polished flat such as by a chemical-mechanical polish.

Polycrystalline silicon substrates suitable as support substrate 30 may be manufactured by casting ingots of silicon followed by slicing the ingots into wafers, and polishing the resulting wafers. In one example, a polycrystalline material is cast in a mold for a large size cast. From the cast, 200 mm, 300 mm, or greater cylindrical ingots are drilled and the ingots are used to form the support substrate of the composite wafer. Since the cast mold primarily determines the diameter of the wafer, the increased wafer diameter size from, for example, 200 mm to 300 mm, or greater may be produced without relying upon the development of new ingot casting tools. The focus of this discussion is forming composite wafers of diameters of 200 mm, 300 mm, or greater, in keeping with the current trends in the industry. It is to be appreciated that, where desired, smaller diameter wafers may also be formed according to the methods described herein.

In one embodiment, overlying the surface of support substrate 30 is differentially removable material 20. In the example where support substrate 30 and single crystal layer 10 are each a semiconductor material such as silicon, differentially removable material is silicon dioxide ($SiO_2$) thermally grown or deposited (e.g. by plasma enhanced chemical vapor deposition (PECVD)) to a thickness of, for example, about one micron. Alternatively, the differentially removable layer can be one of silicon nitride and phosphorous or boron doped glass (PBSG).

Overlying differentially removable material 20 on the surface of support structure 30 is single crystal layer 10. Single crystal layer 10 is, for example, a semiconductor material suitable for forming devices therein or thereon. In one embodiment, single crystal layer 10 is introduced to a thickness on the order of 25 to 100 microns.

In one embodiment, the single crystal layer is introduced by thermally bonding a single crystal wafer to an oxidized single or polycrystalline wafer and polishing down the top single crystal layer to a thickness of 25 to 100 microns.

Figure 2:
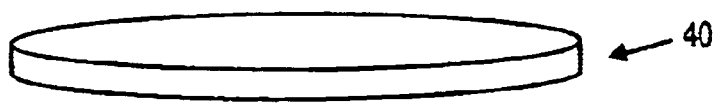
FIG. 2 is a schematic, cross-sectional side view of a grinding or polishing used to thin the single crystal layer of FIG. 1.
Figure 2:
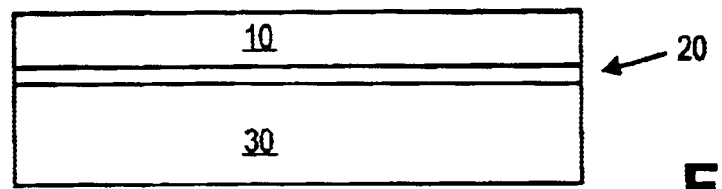

FIG. 2 illustrates the composite structure being thinned such as through a polish (grinding) or chemical-mechanical polish using polishing pad and slurry 40. In one embodiment, single crystal layer 10 may be thinned to a thickness of less than 100 microns. At this point single crystal silicon wafer is attached to a support substrate 30. The composite structure protects thinned single crystal layer 10 from damage from warping or breakage during subsequent circuit processing.

Figure 3:
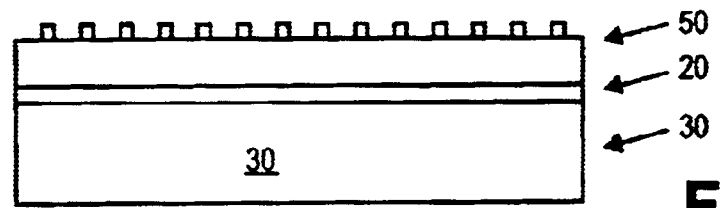
FIG. 3 shows the structure of FIG. 1 after the integrated circuit devices are manufactured (or fabricated) in the thinned single crystal layer.

FIG. 3 shows the integrated circuit introduced onto the thinned single crystal layer 10 of the composite structure. In this embodiment, integrated circuits 50 are fabricated in and/or on the thinned single crystal layer. Conventional processing techniques may be used to introduce the integrated circuit into the thin single crystal silicon layer, because of the support given by the substrate.

Figure 4:
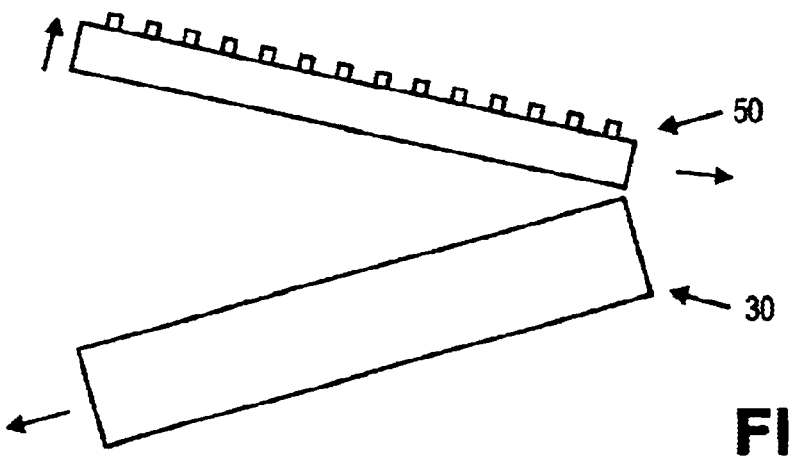
FIG. 4 shows the structure of FIG. 3 and illustrates the separation of the thinned single crystal layer from the support substrate.

Following circuit processing to form, for example, a plurality of integrated circuit dies or chips, FIG. 4 shows thin single crystal layer 10 having integrated circuits 50 fabricated therein and thereon being removed from the support substrate 30. In the example where differentially removable layer 20 is $SiO_2$, thinned single crystal layer 10 may be separated from the composite structure by selectively etching differentially removable layer 20 that bonded the two of them together. Once separated, support substrate 30 can then be discarded or reused along with another single crystal silicon layer.

Figure 5:
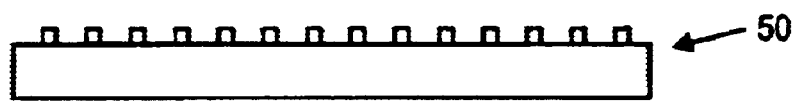
FIG. 5 is a drawing of the thinned single crystal layer separated from the support substrate with integrated circuits introduced thereon and ready for subsequent dicing and stacking.

FIG. 5 shows thinned single crystal layer 10 that has the integrated circuit devices 50 introduced therein. Thinned single crystal layer 10 has a thickness in this embodiment, on the order of less than 100 microns. At this point, thinned single crystal layer 10 may be singulated into individual integrated circuit dies or chips.

Figure 6:
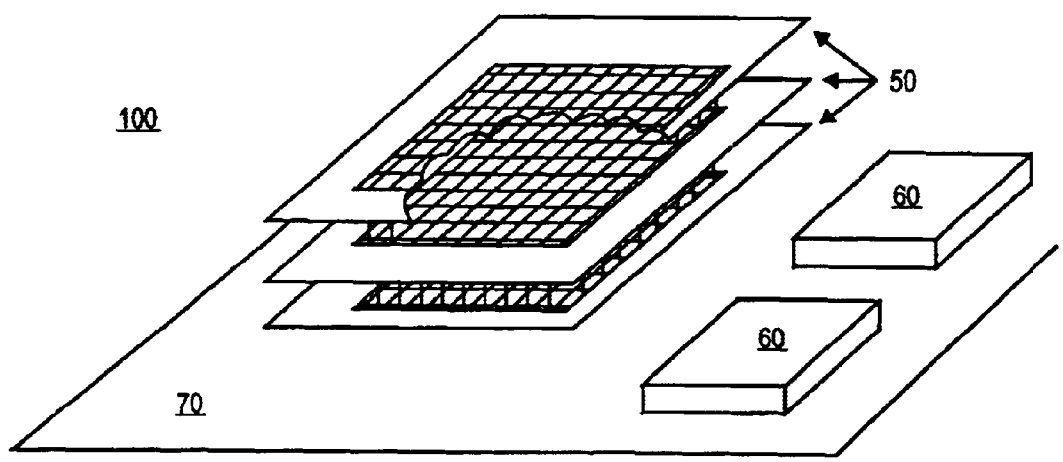
FIG. 6 shows a schematic top perspective view of stacked structure containing more than one integrated circuit on a thinned single crystal layer.

FIG. 6 is a top perspective view of a stack of memory circuits on thinned single crystal layers 50 formed according to the techniques described herein. Memory circuits 50 are stacked one on top of another over an area of circuit board 70 and isolated from one another by, for example, a dielectric material (not shown). Vias and interconnects are disposed between the different layers of memory circuits to communicate, for example, between each other, or between circuits on circuit board 70.

Stacking integrated circuits in, for example, a vertical or y-direction one on top of the other such as is shown in FIG. 6 conserves space in packaging and increases device density. To conserve y-direction space this requires that the stacked circuits be fabricated into very thin silicon. An example of desired stacking of integrated circuits is memory circuits where the available number of memory circuits can be greatly expanded (e.g. doubled, tripled etc.) by stacking memory circuits over a given area of memory board. Applications for this type of packaging include, but are not limited to, cell phones and other mobile appliance applications that require the packing of the high density of elements in a small volume.

What is claimed is:

1. A method comprising:
   coupling a single crystal semiconductor layer on a surface of a polycrystalline semiconductor material substrate, wherein the surface of the substrate comprises a material removable at an accelerated rate relative to the bulk of the substrate with a removing agent selected for preferential removal of the surface material;
   thinning the single crystal layer;
   introducing circuit devices into the thinned single crystal layer; and
   separating the thinned single crystal layer from the substrate with a removing agent selected for preferential removal of the surface.

2. The method of claim 1, wherein a coupling comprises; bonding the single crystal layer to the polycrystalline substrate.

3. The method of claim 1, wherein thinning comprises; chemical mechanical polishing.

4. The method of claim 1, wherein the electrical devices form integrated circuits that interact with other electrical devices off the single crystal layer.

5. The method of claim 4, further comprising; assembling the separated single crystal layer in a stacked arrangement over a substrate to form a three dimensional structure.

6. The method of claim 5, further comprising stacking multiple single crystal layers over the substrate.

* * * * *